US007741183B2

(12) United States Patent
Luo et al.

(10) Patent No.: US 7,741,183 B2
(45) Date of Patent: Jun. 22, 2010

(54) METHOD OF FORMING A GATE DIELECTRIC

(75) Inventors: Tien Ying Luo, Beacon, NY (US); Ning Liu, Austin, TX (US); Mohamed S. Moosa, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 14 days.

(21) Appl. No.: 12/039,361

(22) Filed: Feb. 28, 2008

(65) Prior Publication Data

US 2009/0221120 A1 Sep. 3, 2009

(51) Int. Cl.
*H01L 21/336* (2006.01)
*H01L 21/31* (2006.01)
*H01L 21/469* (2006.01)

(52) U.S. Cl. ............... 438/287; 438/197; 438/762; 438/763; 257/E21.409

(58) Field of Classification Search ......... 438/758, 438/197, 287, 761–763, 778, 791–792; 257/E21.409
See application file for complete search history.

(56) References Cited

U.S. PATENT DOCUMENTS

| 6,114,258 | A * | 9/2000 | Miner et al. ............... 438/787 |
| 6,184,155 | B1 | 2/2001 | Yu et al. |
| 7,001,852 | B2 | 2/2006 | Luo et al. |
| 7,265,065 | B2 | 9/2007 | Wang et al. |
| 2001/0041250 | A1 * | 11/2001 | Werkhoven et al. ......... 428/212 |
| 2002/0079523 | A1 * | 6/2002 | Zheng et al. ............... 257/296 |
| 2002/0197784 | A1 | 12/2002 | Luoh et al. |
| 2004/0018688 | A1 * | 1/2004 | Burnham et al. ........... 438/287 |
| 2007/0207628 | A1 * | 9/2007 | Chua ....................... 438/769 |

FOREIGN PATENT DOCUMENTS

JP 2003309260 A 10/2003

OTHER PUBLICATIONS

Luo et al; "Effect H2 Content on Reliability of Ultrathin In-Situ Steam generated (ISSG) SiO2"; IEEE Electron Device Letters, vol. 21, No. 9, Sep. 2000.

* cited by examiner

*Primary Examiner*—Savitri Mulpuri
*Assistant Examiner*—Calvin Choi
(74) *Attorney, Agent, or Firm*—James L. Clingan, Jr.; Robert L. King

(57) ABSTRACT

A method of forming a semiconductor device includes providing a substrate for the semiconductor device. A base oxide layer is formed overlying the substrate by applying a rapid thermal oxidation (RTO) of the substrate in the presence of oxygen. A nitrogen-rich region is formed within and at a surface of the base oxide layer. The nitrogen-rich region overlies an oxide region in the base oxide layer. Afterwards, the semiconductor device is annealed in a dilute oxygen and hydrogen-free ambient of below 1 Torr partial pressure of the oxygen. The annealing heals bond damage in both the oxide region and the nitrogen-rich region in the base oxide layer. After annealing the semiconductor device in the dilute oxygen ambient, in-situ steam generation (ISSG) is used to grow and density the oxide region in the base oxide layer at an interface between the substrate and base oxide layer.

18 Claims, 3 Drawing Sheets

METHOD OF FORMING A GATE DIELECTRIC

BACKGROUND

1. Field

This disclosure relates generally to semiconductor devices, and more specifically, to a method of making a gate dielectric for use in making MOS transistors.

2. Related Art

MOS transistors have a gate dielectric that is a critical feature to its use. The gate dielectric directly relates to transistor performance and other characteristics such as reliability and lifetime. Some desirable characteristics include good coupling to the underlying channel, low leakage, and long endurance and lifetime. As gate dielectrics have gotten thinner to improve coupling to the channel, problems with boron penetration have become more significant. Boron penetration adversely impacts the integrity of the gate dielectric and may even penetrate through the gate dielectric into the channel. Thus, it is also desirable for the gate dielectric to be resistant to boron penetration.

Thus, there is a need for making a gate dielectric that improves upon one or more of the issues pointed out above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a gate dielectric is formed by growing a base oxide layer followed by a treatment of plasma nitride that forms a nitrogen-rich area in a top surface region of the base oxide layer. This adds thickness to the base oxide layer. The nitrogen-rich area acts to impede boron penetration and potentially other materials that may be present in the subsequently formed gate electrode that may be harmful to a gate dielectric to be formed from the base oxide layer. An oxygen anneal that has a hydrogen-free ambient is performed that substantially heals the top surface of the base oxide layer where the nitrogen-rich area is formed and the interface with the substrate. A subsequent anneal, which forms an in-situ steam generated (ISSG) oxide using hydrogen and oxygen and/or nitrous oxide ($N_2O$) is performed. The ISSG oxide results in forming a gate dielectric with increased density with less defects as sources of electron/hole traps, especially at the interface with the substrate, that improves the lifetime and reliability of the gate dielectric while still achieving good coupling for the gate electrode to the channel. This is better understood with reference to the drawings and the following description.

Semiconductor substrate 12 described herein is preferably silicon or silicon-on-insulator (SOI) but could perhaps be any semiconductor material or combinations of materials, such as gallium arsenide, silicon germanium, or the like.

Figure 1:
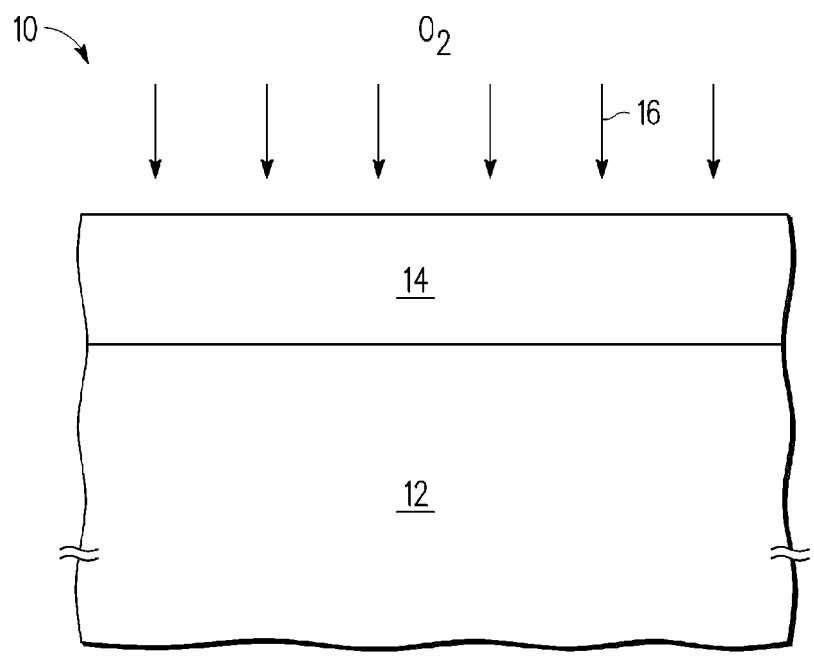
FIG. 1 is a top view of a semiconductor device at a stage in processing according to an embodiment.

Shown in FIG. 1 is a semiconductor device 10 having substrate 12, and a base oxide layer 14 on substrate 12 formed by a rapid thermal oxidation (RTO) process 16. RTO process 16 may be performed by applying oxygen in the form of molecular oxygen ($O_2$) at a temperature between 800 to 900 degrees Celsius. In the described example, the thickness of base oxide 14 is preferably about 13 Angstroms. RTO process 16, as an alternative to just oxygen, may further include nitrogen.

Figure 2:
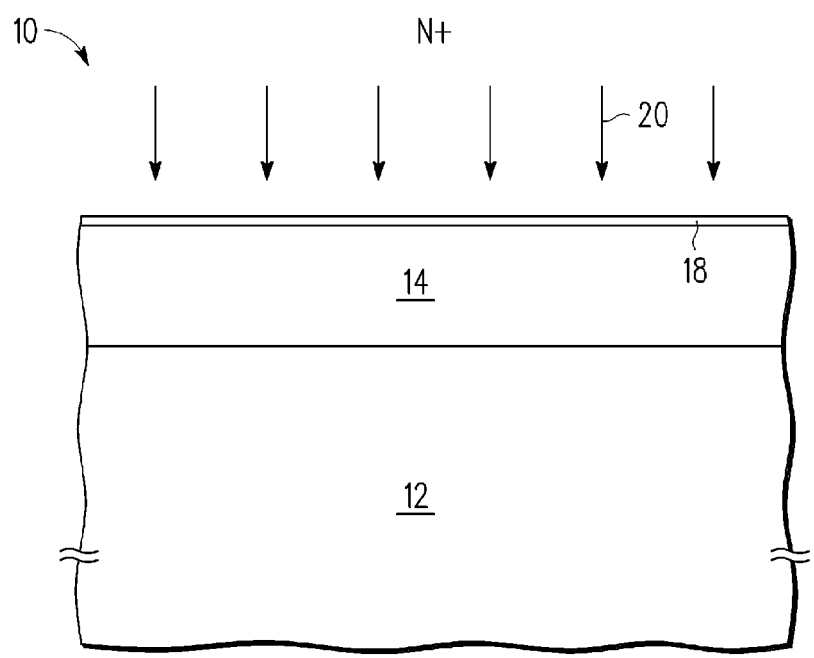
FIG. 2 is a top view of the semiconductor device of FIG. 1 at a subsequent stage in processing.

Shown in FIG. 2 is semiconductor device 10 after performing a plasma nitridation 20 which involves semiconductor device be placed where a nitrogen plasma will be provided. The result is a nitrogen-rich oxide layer 18 formed in base oxide 14. The overall thickness of base layer 14, including nitrogen-rich oxide layer 18, increases by one to one and a half Angstroms. This increase is measured by an ellipsometer using oxide for the dielectric constant. Plasma nitridation 20 is performed by flowing $N_2$ nitrogen in a plasma to incorporate an average nitrogen concentration of 7-9%. Nitrogen-rich oxide layer 18 is about 57% nitrogen from the surface to about 15% at the lower bound and is effective against boron penetration that may come from a gate electrode to be subsequently formed over base oxide layer 14. The nitrogen from plasma nitridation 20 is primarily in what is shown as nitrogen-rich oxide layer 18 but there is a distribution of nitrogen through base oxide 14 at a continuously reduced concentration from about 15% all the way to about 0.5% to 2% at the interface with substrate 12. The reduced nitrogen concentration at the bottom interface reduces current carrier mobility degradation and improves robustness to long-term device instability. Plasma nitridation 20 may be performed at 10 milliTorr and a power of about 130 watts.

Figure 3:
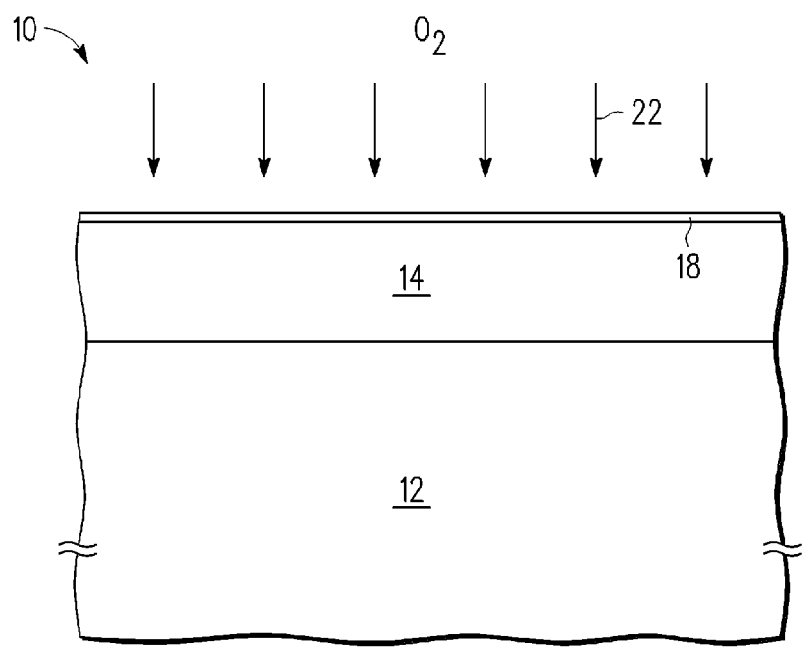
FIG. 3 is a top view of the semiconductor device of FIG. 2 at a subsequent stage in processing.

Shown in FIG. 3 is semiconductor device 10 after performing an oxygen anneal 22. Oxygen anneal 22 is performed using just molecular oxygen ($O_2$) at a temperature between 950 and 1050 degrees Celsius at a partial pressure of about 0.5 Torr for about 15 seconds. A higher or lower partial pressure may be used but the partial pressure should preferably be below 1.0 Torr. Oxygen anneal 22 repairs the surface of base oxide 14 and the interface between base oxide 14 and substrate 12. Plasma nitridation 20, being plasma, adversely effects the surface of base oxide layer. For example, plasma nitridation 20 causes undesirable surface roughness and defects within base oxide 14. Oxygen anneal 22 smoothes out the undesirable surface roughness, heals the defects, and pre-existing interface states at substrate 12. As an alternative a carrier may be included such as nitrogen, but oxygen anneal 22 should not have any hydrogen introduced. Although there will almost certainly be trace amounts of hydrogen present, oxygen anneal 22 may be considered hydrogen-free because the trace amounts have minimal affect and no hydrogen is introduced. Also because of the minimal hydrogen, oxygen anneal 22 may also be considered a dry oxygen anneal. There is minimal oxide growth at this low concentration of oxygen, absence of hydrogen, and short time period. This oxygen anneal may also be called a dilute oxygen anneal because the oxygen concentration is low by mixing with $N_2$ nitrogen. Also there is minimal change in the nitrogen profile in base oxide 14. The dielectric constant also increases to some extent, perhaps because of increased coordination of the nitrogen.

Figure 4:
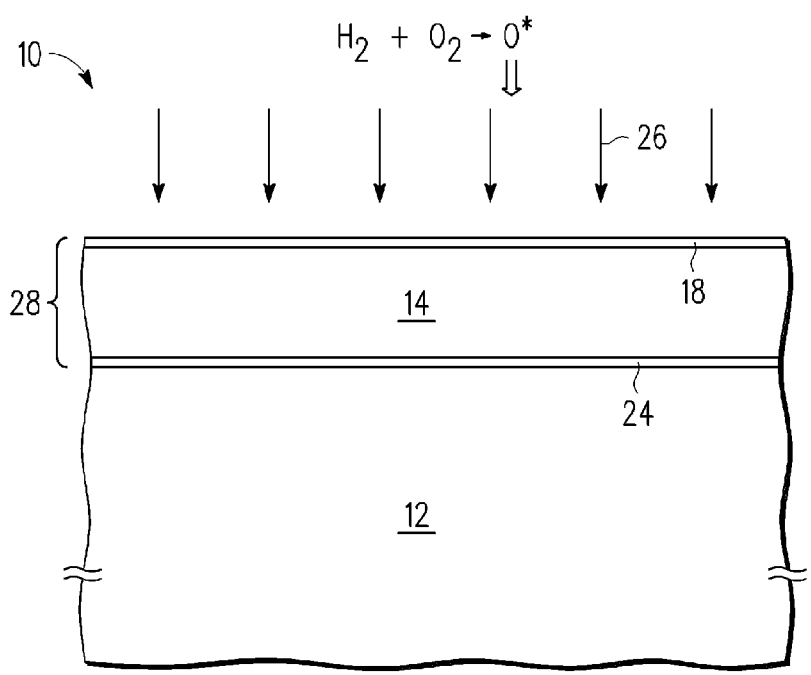
FIG. 4 is a top view of the semiconductor device of FIG. 3 at a subsequent stage in processing.

Shown in FIG. 4 is semiconductor device 10 after performing an in-situ steam generated (ISSG) oxide process 26 to grow an additional oxide layer 24 on substrate 12. Base oxide layer 14, which includes nitrogen-rich oxide layer 18, and oxide layer 24 together form dielectric 28 that may be used as a gate dielectric. Oxide layer 24 is about 0.5 to 1.0 Angstroms thick. ISSG oxide process 26 includes introducing molecular oxygen and molecular hydrogen that results in forming steam (H2O) and radical oxygen (O*). ISSG oxide process 26 may be performed at about 850 to 950 degrees Celsius with less than 1% hydrogen. The other 99% or more may be oxygen or a combination of oxygen and nitrous oxide (N2O). Oxide layer 24 is shown as a separate layer to show the increase in growth to base oxide 14. There would not, however, be a visible dividing line between the new growth of oxide layer 24 and base layer 14. ISSG oxide process 26 has the effect of forming a high quality oxide interface, oxide layer 24, with substrate 12 and densifying base oxide 14. The densification and high quality interface at substrate 12 results in dielectric 28 having increased lifetime for the transistor formed thereon.

Figure 5:
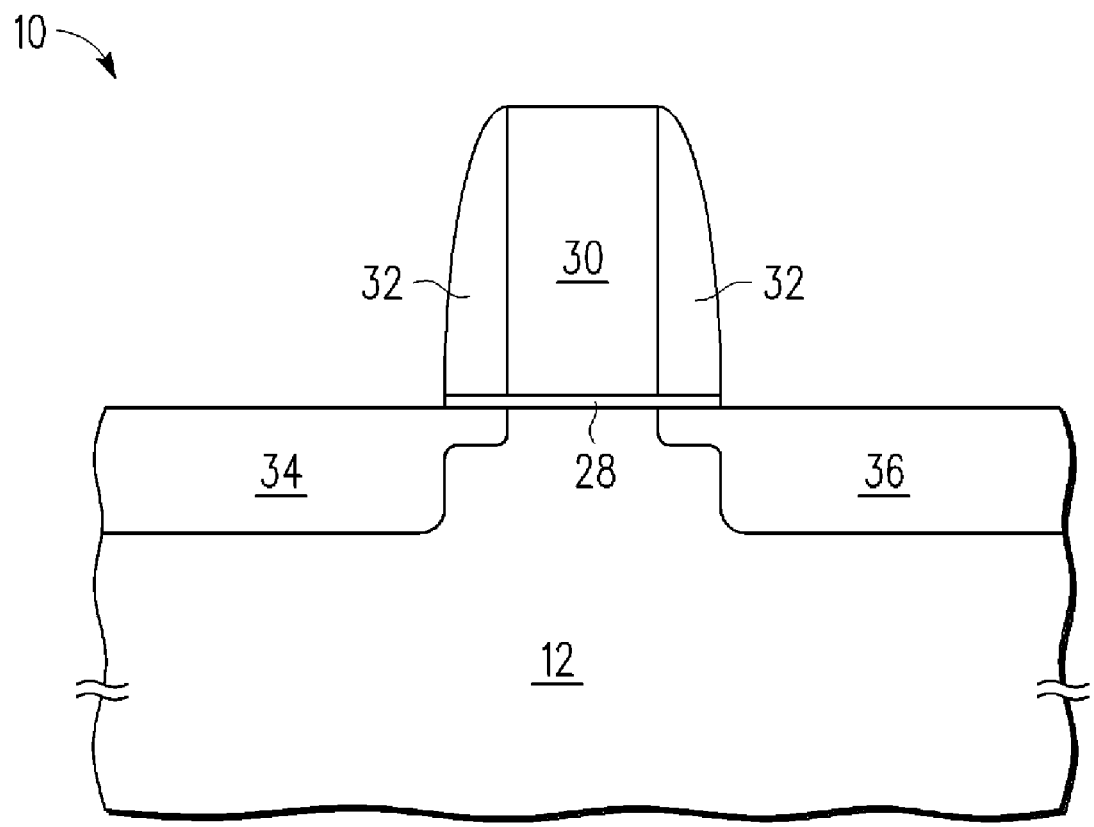
FIG. 5 is a top view of the semiconductor device of FIG. 4 at a subsequent stage in processing.

Shown in FIG. 5 is semiconductor device 10 after steps for forming a transistor using dielectric 28 as a gate dielectric. The transistor includes a gate electrode 30 over gate dielectric 28, a sidewall spacer 32 around gate 30, a source/drain 34 in substrate 12 on one side of gate electrode 30, and a drain 36 in substrate 12 on the other side of gate electrode 30. A channel is in substrate 12, under dielectric 28, and between source/drains 34 and 36. The result is a transistor with a gate dielectric that has nitrogen where the concentration is highest at the interface between the gate electrode and the gate dielectric. This interface is one of the primary regions where boron or other contaminant will begin its attempted penetration while also having the benefits of healing of the gate dielectric using a dilute oxygen anneal and the lifetime and densification benefits resulting from an ISSG anneal. It is important that the dilute anneal occur before the ISSG anneal because the growth rate will be too great if the ISSG anneal occurs before the defects are corrected by the dilute oxygen anneal.

By now it should be appreciated that there has been provided a method of forming a semiconductor device. The method includes providing a substrate for the semiconductor device. The method further includes forming a base oxide layer overlying the substrate by applying a rapid thermal oxidation (RTO) of the substrate in the presence of oxygen. The method further includes forming a nitrogen-rich region within and at a surface of the base oxide layer, the nitrogen-rich region overlying an oxide region in the base oxide layer. The method further includes after forming the nitrogen-rich region in the base oxide layer, annealing the semiconductor device in a dilute oxygen and hydrogen-free ambient of below 1 Torr partial pressure of the oxygen to heal bond damage in both the oxide region and the nitrogen-rich region in the base oxide layer. The method further includes after annealing the semiconductor device in the dilute oxygen ambient, subjecting the semiconductor device to an in-situ steam generation (ISSG) to grow and density the oxide region in the base oxide layer at an interface between the substrate and base oxide layer. The method may be further characterized by the annealing the semiconductor device in the dilute oxygen and hydrogen-free ambient further comprising annealing the semiconductor device at a temperature in a range of 950 to 1,050 degrees Celsius and at an oxygen partial pressure of substantially 0.5 Torr. The method may be further characterized by the step of subjecting the semiconductor device to in-situ steam generation (ISSG) being performed at a temperature in a range of 850 to 950 degrees Celsius. The method may be further characterized by the base oxide layer comprising an original thickness of substantially thirteen Angstroms, the nitrogen-rich layer comprises a thickness of substantially five to seven Angstroms, and the base oxide layer may be grown by a thickness of substantially one-half to one Angstrom at the interface. The method may further comprise using the oxide region and the nitrogen-rich region in the base oxide layer as a gate dielectric, forming a transistor gate overlying the gate dielectric, forming source and drain diffusions in the substrate and adjacent the overlying transistor gate, and forming a sidewall spacer that is laterally adjacent sides of the transistor gate. The method may be further characterized by the step of forming the base oxide layer further comprising forming the base oxide layer at a temperature of substantially 800 to 900 degrees Celsius and annealing the semiconductor device in a dilute oxygen ambient at a temperature of substantially 950 to 1,050 degrees Celsius. The method may be further characterized by the step of forming the base oxide layer further comprising forming the base oxide layer with an average nitrogen concentration across its depth of substantially seven to nine percent nitrogen. The method may be further characterized by the nitrogen-rich region of the base oxide layer comprising a first nitrogen concentration across its depth within a range of no more than substantially fifty-seven percent nitrogen and no less than fifteen percent, and the oxide region of the base oxide layer comprising a second nitrogen concentration across its depth within a range of substantially fifteen percent to 0.1 percent nitrogen. The method may be further characterized by the nitrogen-rich region within and at the surface of the base oxide layer being formed by placing the substrate and base oxide layer in a nitrogen plasma.

Also disclosed is a method comprising sequential steps. The first step includes providing a semiconductor substrate. The next step includes forming a base oxide layer overlying the semiconductor substrate and forming an interface at a boundary thereof. The next step includes forming a nitrogen-rich layer overlying the base oxide layer by plasma incorporation of nitrogen into the base oxide layer. The next step includes annealing the semiconductor substrate, the base oxide layer and the nitrogen-rich layer in a dilute oxygen and hydrogen-free ambient of below 1 Torr partial pressure of oxygen to heal bond damage in both the base oxide layer and the nitrogen-rich layer. The next step includes placing the semiconductor substrate, base oxide layer and nitrogen-rich layer in an ambient for in-situ steam generation (ISSG), the ISSG growing and densifying the base oxide layer at the interface between the semiconductor substrate and the base oxide layer. The method may be further characterized by the step of annealing the semiconductor substrate in the dilute oxygen and hydrogen-free ambient further comprising annealing at a temperature in a range of 950 to 1,050 degrees Celsius and at an oxygen partial pressure of substantially 0.5 Torr. The method may further comprise performing the in-situ steam generation at a temperature in a range of 850 to 950 degrees Celsius. The method may be further characterized by the base oxide layer comprising an original thickness of substantially thirteen Angstroms, the nitrogen-rich layer comprising a thickness of substantially five to seven Angstroms, and the base oxide layer being grown by a thickness of substantially one-half to one Angstrom at the interface. The method may further comprise using the base oxide layer and the nitrogen-rich layer as a gate dielectric, forming a transistor gate overlying the gate dielectric, forming source and drain diffusions in the semiconductor substrate and adjacent the overlying transistor gate, and forming a sidewall spacer laterally adjacent sides of the transistor gate. The method may be further characterized by the step of forming the base oxide layer further comprising forming the base oxide layer at a temperature of substantially 800 to 900 degrees Celsius and annealing in a dilute oxygen ambient at a temperature of substantially 950 to 1,050 degrees Celsius. The method may be further characterized by the base oxide layer comprising an average nitrogen concentration across its depth of substantially seven to nine percent nitrogen.

There is also provided a method including providing a silicon substrate. The method also includes forming a dielectric layer overlying the silicon substrate and adjoining at an interface thereof. The method also includes introducing nitrogen into the dielectric layer with a nonlinear distribution of nitrogen through a depth of the dielectric layer, a greatest amount of nitrogen being present at an exposed surface of the dielectric layer. The method also includes annealing the silicon substrate and the dielectric layer in a dilute oxygen ambient at a temperature of at least 1,000 degrees Celsius, the dilute oxygen ambient being hydrogen-free and having an oxygen partial pressure below 1 Torr to heal bond damage in the dielectric layer. The method also includes after annealing the silicon substrate and the dielectric layer in the dilute oxygen ambient, subjecting the silicon substrate and the dielectric layer to an in-situ steam generation (ISSG) to grow and density the dielectric layer at the interface between the silicon substrate and the dielectric layer. The method may further comprise annealing the silicon substrate and the dielectric layer in a dilute oxygen ambient at an oxygen partial pressure of substantially 0.5 Torr. The method may be further characterized by the dielectric layer comprising an average nitrogen concentration across its depth of substantially seven to nine percent nitrogen. The method may be further characterized by an upper portion of the dielectric layer comprising a nitrogen-rich region of the dielectric layer and comprising a first nitrogen concentration across its depth within a range of no more than substantially fifty-seven percent nitrogen and no less than fifteen percent and a remaining underlying portion of the dielectric layer comprising a second nitrogen concentration across its depth within a range of substantially fifteen percent to 0.1 percent nitrogen.

Although the invention is described herein with reference to specific embodiments, various modifications and changes can be made without departing from the scope of the present invention as set forth in the claims below. For example, base oxide 14 was described to be grown to a thickness of 13 Angstroms, but another thickness may be found to be effective. Similarly, the thicknesses of the other layers were also described but other thicknesses than those described may also be found to be effective. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of forming a semiconductor device comprising:
   providing a substrate for the semiconductor device;
   forming a base oxide layer overlying the substrate by applying a rapid thermal oxidation (RTO) of the substrate in the presence of oxygen;
   forming a nitrogen-rich region within and at a surface of the base oxide layer, the nitrogen-rich region overlying an oxide region in the base oxide layer;
   after forming the nitrogen-rich region in the base oxide layer, annealing the semiconductor device in a dilute oxygen and hydrogen-free ambient of below 1 Torr partial pressure of the oxygen to heal bond damage in both the oxide region and the nitrogen-rich region in the base oxide layer;
   after annealing the semiconductor device in the dilute oxygen ambient, subjecting the semiconductor device to an in-situ steam generation (ISSG) to grow and densify the oxide region in the base oxide layer at an interface between the substrate and base oxide layer;
   forming a gate electrode on the nitrogen-rich region; and
   forming a source in the substrate on a first side of the gate electrode and drain in the substrate on a second side of the gate electrode.

2. The method of claim 1 wherein annealing the semiconductor device in the dilute oxygen and hydrogen-free ambient further comprises annealing the semiconductor device at a temperature in a range of 950 to 1,050 degrees Celsius and at an oxygen partial pressure of substantially 0.5 Torr.

3. The method of claim 1 wherein subjecting the semiconductor device to in-situ steam generation (ISSG) is performed at a temperature in a range of 850 to 950 degrees Celsius.

4. The method of claim 1 wherein the base oxide layer comprises an original thickness of substantially thirteen Angstroms, the nitrogen-rich layer comprises a thickness of substantially five to seven Angstroms, and the base oxide layer is grown by a thickness of substantially one-half to one Angstrom at the interface.

5. The method of claim 1 wherein forming the base oxide layer further comprises forming the base oxide layer at a temperature of substantially 800 to 900 degrees Celsius and annealing the semiconductor device in a dilute oxygen ambient at a temperature of substantially 950 to 1,050 degrees Celsius.

6. The method of claim 1 wherein forming the base oxide layer further comprises forming the base oxide layer with an average nitrogen concentration across its depth of substantially seven to nine percent nitrogen.

7. The method of claim 1 wherein the nitrogen-rich region of the base oxide layer comprises a first nitrogen concentration across its depth within a range of no more than substantially fifty-seven percent nitrogen and no less than fifteen percent, and the oxide region of the base oxide layer comprises a second nitrogen concentration across its depth within a range of substantially fifteen percent to 0.1 percent nitrogen.

8. The method of claim 1 wherein the nitrogen-rich region within and at the surface of the base oxide layer is formed by placing the substrate and base oxide layer in a nitrogen plasma.

9. A method comprising the sequential steps of:
   providing a semiconductor substrate;
   forming a base oxide layer overlying the semiconductor substrate and forming an interface at a boundary thereof;
   forming a nitrogen-rich layer overlying the base oxide layer by plasma incorporation of nitrogen into the base oxide layer;

annealing the semiconductor substrate, the base oxide layer and the nitrogen-rich layer in a dilute oxygen and hydrogen-free ambient of below 1 Torr partial pressure of oxygen to heal bond damage in both the base oxide layer and the nitrogen-rich layer;

placing the semiconductor substrate, base oxide layer and nitrogen-rich layer in an ambient for in-situ steam generation (ISSG), the ISSG growing and densifying the base oxide layer at the interface between the semiconductor substrate and the base oxide layer;

using the base oxide layer and the nitrogen-rich layer as a gate dielectric;

forming a transistor gate overlying the gate dielectric;

forming source and drain diffusions in the semiconductor substrate and adjacent the overlying transistor gate; and forming a sidewall spacer laterally adjacent sides of the transistor gate.

10. The method of claim 9 wherein annealing the semiconductor substrate in the dilute oxygen and hydrogen-free ambient further comprises annealing at a temperature in a range of 950 to 1,050 degrees Celsius and at an oxygen partial pressure of substantially 0.5 Torr.

11. The method of claim 9 further comprising performing the in-situ steam generation at a temperature in a range of 850 to 950 degrees Celsius.

12. The method of claim 9 wherein the base oxide layer comprises an original thickness of substantially thirteen Angstroms, the nitrogen-rich layer comprises a thickness of substantially five to seven Angstroms, and the base oxide layer is grown by a thickness of substantially one-half to one Angstrom at the interface.

13. The method of claim 9 wherein forming the base oxide layer further comprises forming the base oxide layer at a temperature of substantially 800 to 900 degrees Celsius and annealing in a dilute oxygen ambient at a temperature of substantially 950 to 1,050 degrees Celsius.

14. The method of claim 9 wherein the base oxide layer comprises an average nitrogen concentration across its depth of substantially seven to nine percent nitrogen.

15. A method comprising:

providing a silicon substrate;

forming a dielectric layer overlying the silicon substrate and adjoining at an interface thereof;

introducing nitrogen into the dielectric layer with a non-linear distribution of nitrogen through a depth of the dielectric layer, a greatest amount of nitrogen being present at an exposed surface of the dielectric layer;

annealing the silicon substrate and the dielectric layer in a dilute oxygen ambient at a temperature of at least 1,000 degrees Celsius, the dilute oxygen ambient being hydrogen-free and having an oxygen partial pressure below 1 Torr to heal bond damage in the dielectric layer;

after annealing the silicon substrate and the dielectric layer in the dilute oxygen ambient, subjecting the silicon substrate and the dielectric layer to an in-situ steam generation (ISSG) to grow and densify the dielectric layer at the interface between the silicon substrate and the dielectric layer forming a gate electrode on the dielectric layer; and forming a source in the substrate on a first side of the gate electrode and drain in the substrate on a second side of the gate electrode.

16. The method of claim 15 further comprising annealing the silicon substrate and the dielectric layer in a dilute oxygen ambient at an oxygen partial pressure of substantially 0.5 Torr.

17. The method of claim 15 wherein the dielectric layer comprises an average nitrogen concentration across its depth of substantially seven to nine percent nitrogen.

18. The method of claim 15 wherein an upper portion of the dielectric layer comprises a nitrogen-rich region of the dielectric layer and comprises a first nitrogen concentration across its depth within a range of no more than substantially fifty-seven percent nitrogen and no less than fifteen percent, a remaining underlying portion of the dielectric layer comprising a second nitrogen concentration across its depth within a range of substantially fifteen percent to 0.1 percent nitrogen.

* * * * *